(12) United States Patent
He et al.

(10) Patent No.: US 8,445,605 B2
(45) Date of Patent: May 21, 2013

(54) HALOGEN-FREE FLAME RETARDANT RESIN COMPOSITION, AND, PREPREG, LAMINATE, AND LAMINATE FOR PRINTED CIRCUIT MADE THEREFROM

(75) Inventors: Yueshan He, Dongguan (CN); Tao Cheng, Dongguan (CN); Shiguo Su, Dongguan (CN); Biwu Wang, Dongguan (CN); Jie Li, Dongguan (CN)

(73) Assignee: Guangdong Shengyi Sci. Tech Co., Ltd, Dongguan, Guangdong (CN)

( * ) Notice: Subject to any disclaimer, the term of this patent is extended or adjusted under 35 U.S.C. 154(b) by 291 days.

(21) Appl. No.: 12/861,742

(22) Filed: Aug. 23, 2010

(65) Prior Publication Data

US 2011/0045303 A1 Feb. 24, 2011

(30) Foreign Application Priority Data

Aug. 24, 2009 (CN) .......................... 2009 1 0189728

(51) Int. Cl.
| | |
|---|---|
| *B32B 15/08* | (2006.01) |
| *B32B 17/04* | (2006.01) |
| *B32B 27/04* | (2006.01) |
| *B32B 27/38* | (2006.01) |
| *C08K 3/20* | (2006.01) |
| *C08K 3/36* | (2006.01) |
| *C08L 61/06* | (2006.01) |
| *C08L 63/02* | (2006.01) |
| *C08L 63/04* | (2006.01) |
| *C08K 7/14* | (2006.01) |

(52) U.S. Cl.
USPC ........ 525/481; 174/255; 428/297.4; 428/413; 428/418; 523/457; 523/466

(58) Field of Classification Search
None
See application file for complete search history.

(56) References Cited

U.S. PATENT DOCUMENTS

| | | | |
|---|---|---|---|
| 5,639,808 A | 6/1997 | Coggio et al. | |
| 2002/0119317 A1* | 8/2002 | Gan et al. ...................... | 428/413 |
| 2003/0004240 A1* | 1/2003 | Harashina et al. ............ | 524/138 |
| 2003/0148107 A1 | 8/2003 | Suzuki et al. | |
| 2004/0076805 A1 | 4/2004 | Oohori et al. | |

FOREIGN PATENT DOCUMENTS

| | | |
|---|---|---|
| CN | 1219822 C | 9/2005 |
| CN | 100341938 C | 10/2007 |
| CN | 100384932 C | 4/2008 |
| CN | 101643570 | 2/2010 |
| CN | 101684191 | 3/2010 |
| EP | 2 290 009 | 3/2011 |
| JP | 2002-179887 | 6/2002 |
| JP | 2004-043339 | 2/2004 |
| JP | 2005-15510 A * | 1/2005 |
| WO | WO 02-06399 | 1/2002 |

OTHER PUBLICATIONS

European Search Report issued in European Application No. 10173740, mailed Jan. 27, 2011.
European Search Report issued in European Application No. 10173756, completed Dec. 22, 2010.

* cited by examiner

*Primary Examiner* — Robert Sellers
(74) *Attorney, Agent, or Firm* — Parker Highlander PLLC

(57) ABSTRACT

The present invention provides a halogen-free flame retardant resin composition, and, a prepreg, a laminate, and a laminate for printed circuit that are made from the halogen-free flame retardant resin composition. The halogen-free flame retardant resin composition comprises: (A) 40-80 parts by weight of the mixture of a phenoxyphosphazene compound (A1) and a dihydrobenzoxazine ring-containing compound (A2), and, the weight ratio between the phenoxyphosphazene compound (A1) and the dihydrobenzoxazine ring-containing compound (A2) being between 1:10 and 1:2; (B) 15-45 parts by weight of a polyepoxy compound; (C) 5-25 parts by weight of a phenolic resin type hardener; and (D) 0.1-1 parts by weight of an imidazole type compound as the curing accelerator. The prepreg, the laminate, and the laminate for printed circuit that are made from the halogen-free flame retardant resin composition provided by the present invention, have excellent flame retardancy, as well as has high glass transition temperature (Tg), high thermal resistance, high flexural strength, high reliability, low dielectric dissipation factor, low moisture, low C.T.E, good chemical resistance, and good processability.

9 Claims, No Drawings

HALOGEN-FREE FLAME RETARDANT RESIN COMPOSITION, AND, PREPREG, LAMINATE, AND LAMINATE FOR PRINTED CIRCUIT MADE THEREFROM

FIELD OF THE INVENTION

The present invention relates to a resin composition, especially relates to a halogen-free flame retardant resin composition, and a prepreg, a laminate, and a laminate for printed circuit that are made from the halogen-free flame retardant resin composition

BACKGROUND OF THE INVENTION

Since always, laminates used for printed circuit usually adopt a halogen flame retardant to prevent burning, particularly adopt tetrabromobisphenol-A epoxy resin. This brominated epoxy resin has good flame retardancy, but it will produce hydrogen bromide gas when burning. Besides, in recent years, carcinogens, such as dioxin and dibenzofuran, are detected in the combustion products of waste electrical and electronic equipments containing halogens such as chlorine and bromine. So, the application of brominated epoxy resins is limited.

With the EU directives on WEEE (Waste Electrical and Electronic Equipment) and RoHS (Restriction of Hazardous Substances in Electrical and Electronic Equipment) being put into practice in Jul. 1, 2006, developing halogen-free and flame-retardant laminates used in printed circuits has become the key work of the industry.

On the other hand, with the lead-free times coming, for a printed circuit board, besides the halogen-free flame retardant property, the function of being compatible with lead-free soldering also becomes important. So, laminates used for printed circuit also require more thermal resistance and reliability than ever before.

To solve the above mentioned problems, the Chinese patent No. ZL200410051855.3 disclosed a resin composition that adopts phosphorus-containing epoxy resin and bisphenol-A benzoxazine resin as the base resin. The cured resin has high glass transition temperature (Tg), high thermal resistance, low dielectric dissipation factor, low C.T.E, and good flame retardancy. But, since the base resin is phosphorus-containing epoxy resin and bisphenol-A benzoxazine resin, the cured resin is comparatively brittle, and has general processability, low flexural strength and comparatively poor chemical resistance.

And, the Chinese patent No. ZL02803484.8 disclosed a resin composition that adopts bisphenol-F benzoxazine resin and bisphenol-F epoxy resin as the base resin. The cured resin has high glass transition temperature (Tg), high thermal resistance, high modulus of elasticity, low dielectric dissipation factor, good flame retardancy, and good processability. But, since a condensed phosphate type flame retardant is added to the resin composition, the chemical resistance and anti-CAF property of the cured resin can not be guaranteed, that is, the long term reliability is under great risk.

Besides, the Chinese patent No. ZL01814589.2 disclosed an epoxy resin composition of halogen-free flame retardant type that adopts a phenoxyphosphazene compound. The laminates used for printed circuit that use the resin composition have good thermal resistance, low moisture and good flame retardancy. Comparing the above mentioned phenoxyphosphazene flame retardant with common phosphorus-containing flame retardants (such as condensed phosphate), it can be dissolved in an organic solvent, and be easily evenly distributed in a resin composition. And, it has the advantages such as having a comparatively high thermal decomposition temperature, having low moisture, and being hard to hydrolyze. But, since the base resin of the resin composition in the patent is an ordinary epoxy resin and phenolic resin, which does not have flame retardancy itself, plenty of phenoxyphosphazene compound (about 23-31 wt %) must be added to it in order to impart enough flame retardancy. If the laminates are at high temperature condition, the phenoxyphosphazene compound may migrate or even bleed out, and the physical properties such as flexural strength will fall off sharply.

SUMMARY OF THE INVENTION

An object of the present invention is to provide a halogen-free flame retardant resin composition, which greatly improves the flame retardancy by utilizing the synergetic flame retardant effect of a phenoxyphosphazene compound and a dihydrobenzoxazine ring-containing compound.

Another object of the present invention is to provide a prepreg made from the halogen-free flame retardant resin composition, which has excellent flame retardancy, as well as has high glass transition temperature (Tg), high thermal resistance, high flexural strength, high reliability, low dielectric dissipation factor, low moisture, low C.T.E, good chemical resistance, and good processability.

Another object of the present invention is to provide a laminate made from the halogen-free flame retardant resin composition, which has excellent flame retardancy, as well as has high glass transition temperature (Tg), high thermal resistance, high flexural strength, high reliability, low dielectric dissipation factor, low moisture, low C.T.E, good chemical resistance, and good processability.

Another object of the present invention is to provide a laminate for printed circuit made from the halogen-free flame retardant resin composition, which has excellent flame retardancy, as well as has high glass transition temperature (Tg), high thermal resistance, high flexural strength, high reliability, low dielectric dissipation factor, low moisture, low C.T.E, good chemical resistance, and good processability.

To achieve the above mentioned objects, the present invention provides a halogen-free flame retardant resin composition, which comprises, calculating according to the parts by weight of organic solids:

(A) 40-80 parts by weight of the mixture of a phenoxyphosphazene compound (A1) and a dihydrobenzoxazine ring-containing compound (A2), and, the weight ratio between the phenoxyphosphazene compound (A1) and the dihydrobenzoxazine ring-containing compound (A2) being between 1:10 and 1:2;

(B) 15-45 parts by weight of a polyepoxy compound;

(C) 5-25 parts by weight of a phenolic resin type hardener;

(D) 0.1-1 parts by weight of an imidazole type compound as the curing accelerator.

The present invention also provides a prepreg made from the halogen-free flame retardant resin composition, which comprises a base material, and the halogen-free flame retardant resin composition that adheres to the base material after the base material is impregnated in the resin composition and then is dried.

The present invention also provides a laminate made from the halogen-free flame retardant resin composition, which comprises a plurality of prepregs mutually overlapped; each prepreg includes a base material, and the halogen-free flame retardant resin composition that adheres to the base material after the base material is impregnated in the resin composition and then is dried.

The present invention also provides a laminate for printed circuit made from the halogen-free flame retardant resin composition, which comprises a plurality of prepregs mutually overlapped and a metal foil arranged to one or two surfaces of the overlapped prepregs; each prepreg includes a base material, and the halogen-free flame retardant resin composition that adheres to the base material after the base material is impregnated in the resin composition and then is dried.

The advantages of the present invention are that: ① the halogen-free flame retardant resin composition provided by the present invention adopts the phenoxyphosphazene compound as the flame retardant. The phenoxyphosphazene compound and the dihydrobenzoxazine ring-containing compound have a strong synergetic flame retardant effect, so, at the condition of greatly reducing the usage amount of the phenoxyphosphazene compound, the flame retardancy can still be achieved, that is, the flame retardant efficiency is greatly improved. Moreover, when the laminate is at high temperature condition, the problems such as the phenoxyphosphazene compound migrating or even bleeding out and the physical properties like flexural strength falling off sharply will not occur. ② The halogen-free flame retardant resin composition provided by the present invention adopts the phenoxyphosphazene compound as the flame retardant, which has good chemical resistance and is hard to hydrolyze. The prepared copper clad laminate for printed circuit has good chemical resistance and Anti-CAF property, that is, the reliability is good. ③ The halogen-free flame retardant resin composition provided by the present invention adopts a benzoxazine resin as the base resin, so, the prepreg, the laminate and the copper clad laminate for printed circuit that are made from the resin composition have high glass transition temperature (Tg), high thermal resistance, low dielectric dissipation factor, low moisture, and low C.T.E, etc. Furthermore, epoxy resins are introduced to greatly overcome the brittleness of the benzoxazine resin, so, the cured resin has comparatively high flexural strength and good processability.

DESCRIPTION OF THE PREFERRED EMBODIMENTS

Calculating according to the parts by weight of organic solids, the halogen-free flame retardant resin composition of the present invention comprises:

(A) 40-80 parts by weight of the mixture of a phenoxyphosphazene compound (A1) and a dihydrobenzoxazine ring-containing compound (A2), and, the weight ratio between the phenoxyphosphazene compound (A1) and the dihydrobenzoxazine ring-containing compound (A2) being between 1:10 and 1:2;

(B) 15-45 parts by weight of a polyepoxy compound;

(C) 5-25 parts by weight of a phenolic resin type hardener;

(D) 0.1-1 parts by weight of an imidazole type compound as the curing accelerator.

In the present invention, the phosphorus content of the halogen-free flame retardant resin composition is controlled to be between 1 wt % and 5 wt %, and the nitrogen content is controlled to be between 1 wt % and 10 wt %, and the halogen content is controlled to be below 0.09 wt %. The following detailed description describes the components of the present invention.

In the present invention, the softening point of the phenoxyphosphazene compound (A1) in the component (A) is between 60° C. and 150° C., which is a mixture of the compounds selected from the cyclophenoxyphosphazene compounds shown with the structural formula (α) and the linear phenoxyphosphazene compounds shown with the structural formula (β), and the components of the phenoxyphosphazene compound (A1) are as the following:

① hexaphenoxycyclotriphosphazene compound (m=3), of which the weight ratio is between 70% and 90%;

② octaphenoxycyclotetraphosphazene compound (m=4), of which the weight ratio is between 3% and 20%;

③ other cyclophenoxyphosphazene compounds, wherein m≧5, and the linear phenoxyphosphazene compounds, of which the weight ratio are between 1% and 10%;

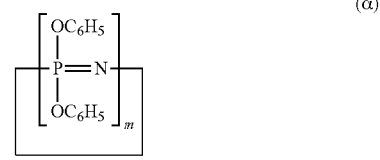

(α)

wherein, m represents an integer between 3 and 25;

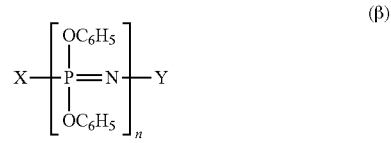

(β)

wherein, X represents —N=P(OC$_6$H$_5$)$_3$ or —N=P(O)C$_6$H$_5$, and Y represents —P(OC$_6$H$_5$)$_4$ or —P(O)(C$_6$H$_5$)$_2$; n represents an integer between 3 and 100.

Comparing to common condensed phosphate flame retardants, the phenoxyphosphazene compound (A1) can be dissolved in an organic solvent, and is easily evenly distributed in a resin composition. And, it has the advantages such as having a comparatively high thermal decomposition temperature, having low moisture, and being hard to hydrolyze. If the components of the phenoxyphosphazene compound (A1) are all the cyclophenoxyphosphazene compounds, its dissolubility in an organic solvent will be not good. So, a certain amount of linear phenoxyphosphazene compound must be contained to prompt its dissolubility. But the content of the linear phenoxyphosphazene compound must be moderate, or will lead to the softening point of the phenoxyphosphazene compound (A1) being relatively low. Besides, if the softening point of the phenoxyphosphazene compound (A1) is lower than 60° C., the glass transition temperature of the cured resin will be reduced; if the softening point is higher than 150° C., the compatibility between the phenoxyphosphazene compound and the other components will become bad. If the usage amount of the phenoxyphosphazene compound (A1) is too little, the flame retardant effect can not be obtained. If the usage amount is too much, the other properties of the cured resin will be affected: if the cured resin is at high temperature condition, the phenoxyphosphazene compound (A1) may migrate or even bleed out, and the physical properties such as flexural strength will fall off sharply.

In the present invention, the phenoxyphosphazene compound (A1) is a nitrogen-containing or phosphorus-containing flame retardant. Its flame-retardant mechanism comprises gas phase flame retardation and solid phase flame retardation. But if it is used alone, the flame retardant material is released comparatively slowly, that is, the flame-retardant efficiency is not high. By compounding the dihydrobenzoxazine ring-containing compound (A2) that has flame retardancy itself and the phenoxyphosphazene compound (A1), they can synergetically accelerate and initiate the phenoxyphosphazene compound (A1) releasing flame retardant materials, so the flame-retardant efficiency can be greatly increased.

In the present invention, the dihydrobenzoxazine ring-containing compound (A2) in the component (A) can be prepared with a hydroxyl-containing phenols compound, primary amine and formaldehyde via the following reaction, and it comprises at least one compound of bisphenol-A benzoxazine resin, bisphenol-F benzoxazine resin, phenolphthalein benzoxazine resin, and MDA (4,4'-Methylenedianiline) benzoxazine resin shown with the structural formula (γ) or (δ) relatively.

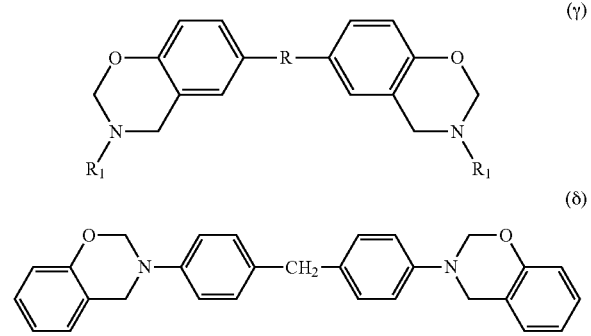

wherein, R is

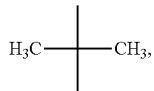

—CH$_2$—, or

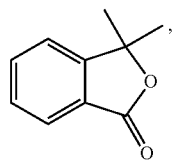

and R1 is

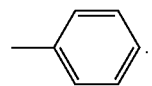

For methylene exists in the molecular structure of the above mentioned bisphenol-F benzoxazine resin, the backbone has a comparatively good toughness while keeping a certain rigidity, while phenolphthalein benzoxazine resin and MDA benzoxazine resin have better heat resistance. The benzoxazine resins can be used alone or along with each other.

The usage amount of the component A is 40-80 parts by weight, and, to guarantee the good synergetic flame retardant effect between the phenoxyphosphazene compound (A1) and the dihydrobenzoxazine ring-containing compound (A2), and to avoid the negative effects of the phenoxyphosphazene compound (A1), the weight ratio between the phenoxyphosphazene compound (A1) and the dihydrobenzoxazine ring-containing compound (A2) is preferred to be between 1:10 and 1:2.

The component (B) of the present invention, that is, the polyepoxy compound, particularly is bisphenol-A epoxy resin, bisphenol-F epoxy resin, phenol novolac epoxy resin, o-cresol novolac epoxy resin, bisphenol-A novolac epoxy resin, oxazolidone ring-containing halogen-free epoxy resin, or epoxide polybutadiene. According to the use, they can be used alone or along with each other. For example, a cured resin that uses bisphenol-F epoxy resin has good toughness, and, a cured resin that uses bisphenol-A novolac epoxy resin or o-cresol novolac epoxy resin has a comparatively high glass transition temperature. The usage amount of the polyepoxy compound had better be 15-45 parts by weight, and the preferred usage amount is 20-40 parts by weight.

The component (C) of the present invention, that is, the phenolic resin type hardener, particularly is phenol novolac resin, bisphenol-A novolac resin, nitrogen-containing novolac resin, or phosphorus-containing novolac resin. They can be used alone or along with each other. Nitrogen-containing novolac resin or phosphorus-containing novolac resin is preferred, since they has good flame retardancy, and can increase the glass transition temperature (Tg) of a cured resin. The usage amount of the component (C) is preferred to be 5-25 parts by weight. If it is lower than 5 parts by weight, the glass transition temperature of the cured resin is increased not much, and if it is higher than 25 parts by weight, the thermal resistance of the cured resin will become bad.

The component (D) of the present invention, that is, the curing accelerator for the resin composition, may be at least one compound of 2-methylimidazole, 2-ethyl-4-methylimidazole, 2-phenylimidazole, and 2-undecylimidazole. The usage amount of the component (D) is 0.1-1 parts by weight.

The present invention can also comprises a component (E), that is, the inorganic filler. The inorganic filler is used to adjust some physical properties of the composition. The inorganic filler may be a general inorganic filler such as aluminium hydroxide, silica, zeolite, wollastonite, silica, magnesium oxide, calcium silicate, calcium carbonate, clay, talcum powder and mica. The inorganic filler can be selected according to the use. Particularly, aluminium hydroxide and silica are preferred, since they can be used as the flame retardant additive for the phenoxyphosphazene compound. For the weight of the organic solids in the halogen-free flame retardant epoxy composition, the usage amount of the inorganic filler is 6-300 parts by weight, and is preferred to be 30-100 parts by weight.

The present invention also provides a prepreg made from the halogen-free flame retardant resin composition, which comprises a base material, and the halogen-free flame retardant resin composition that adheres to the base material after the base material is impregnated in the resin composition and then is dried.

The present invention also provides a laminate made from the halogen-free flame retardant resin composition, which comprises a plurality of prepregs mutually overlapped; each prepreg includes a base material, and the halogen-free flame retardant resin composition that adheres to the base material after the base material is impregnated in the resin composition and then is dried.

The present invention also provides a laminate for printed circuit made from the halogen-free flame retardant resin composition, which comprises a plurality of prepregs mutually overlapped and a metal foil arranged to one or two surfaces of the overlapped prepregs; each prepreg includes a base material, and the halogen-free flame retardant resin composition that adheres to the base material after the base material is impregnated in the resin composition and then is dried.

The prepreg of the present invention is made by heating and drying the above mentioned halogen-free flame retardant resin composition, which uses a nonwoven fabric or other fabrics, such as natural fiber, organic synthesis fiber, and inorganic fiber, as the base material. The conventional preparation method of the resin composition of the present invention comprises: first adding solids in, and then adding a liquid solvent in; stirring until the solids are completely dissolved, then adding a liquid resin and an accelerator in, and then continuing to stir evenly; finally adding PM (1-Methoxy-2-propanol) solvent in to adjust the solid content of the solution to be in the range of 65%-75%, so as to obtain a liquid varnish, that is, the halogen-free flame retardant resin of the present invention; dipping a fabric or an organic fabric, such as a glass cloth, in the liquid varnish; heating and drying the impregnated glass cloth in an oven at 160° C. for 4 minutes, thereby obtaining the resin composition of the present invention.

The laminate for printed circuit of the present invention comprises a laminate that is made by two or over two pieces of prepregs being bonded together via heating and pressurizing, and a metal foil that is bonded to one or two surfaces of the laminate. The laminate is made from eight pieces of the above mentioned prepregs and two pieces of one ounce metal foils (35 μm thick), which are mutually overlapped and then laminated in a laminating machine, so as to produce a laminate with double metal foil surfaces. The lamination should meet the following requirements that: ① the lamination heating rate generally should be controlled in the range of 1.5-2.5° C./min while the material temperature is in the range of 80° C.-140° C.; ② while the outer layer material temperature is in the range of 80° C.-100° C., a full lamination pressure of about 350 psi should be applied; ③ while curing, the material temperature is controlled at 185° C. and kept for 60 min. The material of the metal foil is not limited, which can be a copper foil, a nickel foil, an aluminum foil, or a SUS foil, etc.

By measuring properties, such as dielectric dissipation factor, thermal resistance, moisture, C.T.E, glass transition temperature, and flame retardancy, of the above mentioned produced laminate (eight pieces of prepregs) used for printed circuit, the present invention is further detailedly described with the following embodiments.

Please refer to the embodiments 1-12, and the comparison examples 1-6.

The embodiments of the present invention are detailedly described as follows. The embodiments are not to limit the scope of the present invention. Hereinafter, unless special explanation, the part represents parts by weight, and "%" represents weight percent.

(A1) phenoxyphosphazene compound
SPB-100 (trade name of Otsuka Chemical Co., Ltd);
(A2) dihydrobenzoxazine ring-containing compound
(A2-1) LZ 8280 (trade name of Huntsman Advanced Materials)
(A2-2) D125 (trade name of Sichuan EM Technology)
(B) halogen-free epoxy resin
(B-1) XZ 97103 (trade name of Dow Chemical);
(B-2) EPON SU-8 (trade name of Hexion Specialty Chemicals);
(C) phenolic resin type hardener
(C-1) PHL6635 (trade name of Hexion Specialty Chemicals);
(C-2) PS 6313 (trade name of GUN EI CHEMICAL INDUSTRY CO., LTD.);
(C-3) XZ 92741 (trade name of Dow Chemical);
(D) curing accelerator
2-phenylimidazole (SHIKOKU Chemicals Co.)
(E) inorganic filler
(E-1) aluminium hydroxide (purity over 99%);
(E-2) silica (purity over 99%).

TABLE 1

Formula of Composition I (parts by weight)

|  | Embodiment 1 | Embodiment 2 | Embodiment 3 | Embodiment 4 | Embodiment 5 | Embodiment 6 |
|---|---|---|---|---|---|---|
| $A_1$ | 18 | 18 | 18 | 18 | 18 | 18 |
| $A_2$-1 | 45 | 45 | 45 | 45 |  |  |
| $A_2$-2 |  |  |  |  | 45 | 45 |
| B-1 | 25 | 25 |  |  | 25 |  |
| B-2 |  |  | 25 | 25 |  | 25 |
| C-1 | 4 | 7 | 7 | 4 | 7 | 4 |
| C-2 | 7 | 4 | 4 | 7 | 4 | 7 |
| D | 1.0 | 1.0 | 1.0 | 1.0 | 1.0 | 1.0 |
| E-1 |  |  |  |  |  |  |
| E-2 |  |  |  |  |  |  |

TABLE 2

Formula of Composition II (parts by weight)

|  | Embodiment 7 | Embodiment 8 | Embodiment 9 | Embodiment 10 | Embodiment 11 | Embodiment 12 |
|---|---|---|---|---|---|---|
| $A_1$ | 18 | 15 | 15 | 15 | 15 | 15 |
| $A_2$-1 | 25 | 46 | 46 |  |  | 26 |
| $A_2$-2 | 20 |  |  | 46 | 46 | 20 |
| B-1 |  | 26 |  | 26 |  |  |
| B-2 | 25 |  | 26 |  | 26 | 26 |
| C-1 | 4 | 8 | 4 | 8 | 4 | 4 |
| C-2 | 7 | 4 | 8 | 4 | 8 | 8 |
| D | 1.0 | 1.0 | 1.0 | 1.0 | 1.0 | 1.0 |

TABLE 2-continued

Formula of Composition II (parts by weight)

| | Embodiment 7 | Embodiment 8 | Embodiment 9 | Embodiment 10 | Embodiment 11 | Embodiment 12 |
|---|---|---|---|---|---|---|
| E-1 | | 30 | 10 | 30 | 10 | 10 |
| E-2 | | 10 | 30 | 10 | 30 | 30 |

TABLE 3

Formula of Composition III (parts by weight)

| | Comparison example 1 | Comparison example 2 | Comparison example 3 | Comparison example 4 | Comparison example 5 | Comparison example 6 |
|---|---|---|---|---|---|---|
| $A_1$ | 15 | 15 | 15 | 10 | 25 | 25 |
| $A_2$-1 | 46 | 46 | 46 | 53 | 35 | |
| $A_2$-2 | | | | | | 35 |
| B-1 | 26 | | 16 | 24 | | 28 |
| B-2 | | 26 | 10 | | 28 | |
| C-1 | 4 | 8 | 4 | 8 | 4 | 4 |
| C-2 | | | 8 | 4 | 7 | 7 |
| C-3 | 8 | 4 | | | | |
| D | 1.0 | 1.0 | 1.0 | 1.0 | 1.0 | 1.0 |
| E-1 | 20 | 20 | 20 | 20 | 20 | 20 |
| E-2 | 20 | 20 | 20 | 20 | 20 | 20 |

TABLE 4

Property evaluation I

| | Embodiment 1 | Embodiment 2 | Embodiment 3 | Embodiment 4 | Embodiment 5 | Embodiment 6 |
|---|---|---|---|---|---|---|
| glass transition temperature (Tg, ° C.) | 144 | 156 | 173 | 184 | 167 | 196 |
| peel strength (N/mm) | 1.45 | 1.57 | 1.43 | 1.52 | 1.42 | 1.51 |
| flame retardancy (1.60 mm) | V-0 | V-0 | V-0 | V-0 | V-0 | V-0 |
| flame retardancy (0.80 mm) | V-0 | V-0 | V-0 | V-0 | V-0 | V-0 |
| solder dipping (delamination) | ○ | ○ | ○ | ○ | ○ | ○ |
| solder dipping (measling) | ○ | ○ | ○ | ○ | ○ | ○ |
| moisture (%) | 0.11 | 0.12 | 0.10 | 0.11 | 0.09 | 0.09 |
| dielectric dissipation factor (1 GHZ) | 0.005 | 0.005 | 0.005 | 0.005 | 0.005 | 0.005 |
| flexural strength (N/mm2) | 630 | 650 | 640 | 640 | 540 | 570 |
| punchability | ○ | ○ | ○ | ○ | ○ | ○ |
| halogen content (%) | 0.03 | 0.03 | 0.03 | 0.03 | 0.03 | 0.03 |
| migration resistance | ○ | ○ | ○ | ○ | ○ | ○ |
| Anti-CAF property (hr) | >1000 | >1000 | >1000 | >1000 | >1000 | >1000 |
| alkali resistance | ○ | ○ | Δ | Δ | ○ | Δ |

TABLE 5

Property evaluation II

| | Embodiment 7 | Embodiment 8 | Embodiment 9 | Embodiment 10 | Embodiment 11 | Embodiment 12 |
|---|---|---|---|---|---|---|
| glass transition temperature (Tg, °C.) | 192 | 151 | 163 | 175 | 201 | 198 |
| peel strength (N/mm) | 1.44 | 1.42 | 1.51 | 1.40 | 1.48 | 1.43 |
| flame retardancy (1.60 mm) | V-0 | V-0 | V-0 | V-0 | V-0 | V-0 |
| flame retardancy (0.80 mm) | V-0 | V-0 | V-0 | V-0 | V-0 | V-0 |
| solder dipping (delamination) | ◯ | ◯ | ◯ | ◯ | ◯ | ◯ |
| solder dipping (measling) | ◯ | ◯ | ◯ | ◯ | ◯ | ◯ |
| moisture (%) | 0.10 | 0.08 | 0.08 | 0.08 | 0.08 | 0.08 |
| dielectric dissipation factor (1 GHZ) | 0.005 | 0.005 | 0.005 | 0.005 | 0.005 | 0.005 |
| flexural strength (N/mm2) | 550 | 550 | 550 | 550 | 550 | 550 |
| punchability | ◯ | ◯ | ◯ | ◯ | ◯ | ◯ |
| halogen content (%) | 0.03 | 0.03 | 0.03 | 0.03 | 0.03 | 0.03 |
| migration resistance | ◯ | ◯ | ◯ | ◯ | ◯ | ◯ |
| Anti-CAF property (hr) | >1000 | >1000 | >1000 | >1000 | >1000 | >1000 |
| alkali resistance | Δ | ◯ | Δ | ◯ | Δ | Δ |

TABLE 6

Property evaluation III

| | Comparison example 1 | Comparison example 2 | Comparison example 3 | Comparison example 4 | Comparison example 5 | Comparison example 6 |
|---|---|---|---|---|---|---|
| glass transition temperature (Tg, °C.) | 149 | 157 | 159 | 210 | 141 | 153 |
| peel strength (N/mm) | 1.39 | 1.41 | 1.51 | 1.40 | 1.48 | 1.43 |
| flame retardancy (1.60 mm) | V-0 | V-0 | V-0 | V-0 | V-0 | V-0 |
| flame retardancy (0.08 mm) | V-0 | V-1 | V-0 | V-0 | V-0 | V-0 |
| solder dipping (delamination) | ◯ | ◯ | ◯ | ◯ | ◯ | ◯ |
| solder dipping (measling) | ◯ | ◯ | ◯ | ◯ | ◯ | ◯ |
| moisture (%) | 0.12 | 0.13 | 0.09 | 0.09 | 0.09 | 0.09 |
| dielectric dissipation factor (1 GHZ) | 0.005 | 0.005 | 0.005 | 0.005 | 0.005 | 0.005 |
| flexural strength (N/mm2) | 530 | 510 | 540 | 490 | 500 | 500 |
| punchability | ◯ | ◯ | ◯ | ◯ | ◯ | ◯ |
| halogen content (%) | 0.03 | 0.03 | 0.03 | 0.03 | 0.03 | 0.03 |
| migration resistance | ◯ | ◯ | ◯ | ◯ | Δ | Δ |

TABLE 6-continued

| | Property evaluation III | | | | | |
|---|---|---|---|---|---|---|
| | Comparison example 1 | Comparison example 2 | Comparison example 3 | Comparison example 4 | Comparison example 5 | Comparison example 6 |
| Anti-CAF property (hr) | >1000 | >1000 | >1000 | >1000 | >1000 | >1000 |
| alkali resistance | ○ | Δ | ○ | ○ | Δ | ○ |

Test method of the above mentioned properties is as follows.

(a) Glass Transition Temperature

According to differential scanning calorimetry, glass transition temperature is measured by the DSC method stated in IPC-TM-650 2.4.25.

(b) Peel Strength

According to the experiment condition of "After Thermal Stress" in the method stated in IPC-TM-650 2.4.8, the peel strength of metal cover layer is measured.

(c) Flame-Retardant Property

Flame-retardant property is measured according to the standard of UL94.

(d) Solder Dipping

The sample (a base material of 100×100 mm) is kept for 2 hours in a pressure cooking processing device at 121° C. at 105 Kpa, then it is impregnated in a solder bath at 260° C. for 20 seconds; by visual inspection, it is viewed whether delaminating exists or not, and it is also viewed whether crazing exists or not. In the tables, symbol ○ represents that nothing changes; symbol Δ represents that measling occurs; symbol x represents that delamination occurs.

(e) Moisture

Moisture is measured according to the method stated in IPC-TM-650 2.6.2.1.

(f) Dielectric Dissipation Factor

By the resonance method using a strip line, dielectric dissipation factor at 1 GHz are measured according to IPC-TM-650 2.5.5.5.

(g) Flexural Strength

According to the method stated in IPC-TM-650 2.4.4, at room temperature, loads are applied to the sample of specific dimension and shape to measure.

(h) Punchability

Punch a base material of 1.6 mm thickness with a punching die device of a certain figure, and then it is viewed by visual inspection. Wherein the tables, symbol ○ represents that no haloing is at the hole edge. Symbol Δ represents that the hole edge is provided with a haloing. Symbol x represents that the hole edge is cracked.

(i) Halogen Content

According to Test Method for Halogen-free Materials stated in JPCA-ES-01-2003, the halogen content of a copper clad laminate is measured by oxygen flask combustion method and ion chromatography.

(j) Migration Resistance

Heat a base material of 100×100 mm in an oven at 200° C. for 4 hours, and then it is viewed by visual inspection. Wherein the tables, symbol ○ represents that nothing bleeds out. Symbol Δ represents bleeding out a little. Symbol x represents bleeding out much.

(k) Anti-CAF Property

It is measured according to the method stated in the company standard Q/DZAD650 2.6.25 of Guangdong Shengyi Sci. Tech Co., Ltd.

(l) Alkali Resistance

Dip a base material of 50×50 mm in 10% sodium hydroxide solution at 80° C. for 60 minutes, and then it is viewed by visual inspection. In the tables, symbol ○ represents that nothing changes. Symbol Δ represents measling. Symbol x represents delamination and blister.

In summary, the present invention can obtain the effects of high glass transition temperature, high peel strength, high flexural strength, high reliability, flame retardancy, thermal resistance, chemical resistance, low moisture, and low dielectric dissipation factor, and has good processability. In the range of JPCA halogen-free standard, the halogen content can meet the V-0 standard in the flame retardant property test UL94. The present invention makes full use of the synergetic flame retardant effect of the phenoxyphosphazene compound and the benzoxazine resin, and the halogen content is below 0.09 wt %, so as to realize environmental protection effect.

Although the present invention has been described in detail with above said embodiments, but it is not to limit the scope of the invention. So, all the modifications and changes according to the characteristic and spirit of the present invention, are involved in the protected scope of the invention.

What is claimed is:

1. A halogen-free flame retardant resin composition, calculating according to the parts by weight of organic solids, comprising:

(A) 40-80 parts by weight of the mixture of a phenoxyphosphazene compound (A1) and a dihydrobenzoxazine ring-containing compound (A2), and, the weight ratio between the phenoxyphosphazene compound (A1) and the dihydrobenzoxazine ring-containing compound (A2) being between 1:10 and 1:2;

(B) 15-45 parts by weight of a polyepoxy compound;

(C) 5-25 parts by weight of a phenolic resin hardener;

(D) 0.1-1 parts by weight of an imidazole compound as the curing accelerator, wherein the softening point of the phenoxyphosphazene compound is between 60° C. and 150° C.; the phenoxyphosphazene compound (A1) is a mixture of the cyclophenoxyphosphazene compounds shown with the structural formula (α) and the linear phenoxyphosphazene compounds shown with the structural formula (β), and the components comprise the following:

hexaphenoxycyclotriphosphazene compound (m=3), of which the weight ratio is between 70% and 90%;

octaphenoxycyclotetraphosphazene compound (m=4), of which the weight ratio is between 3% and 20%; and other cyclophenoxyphosphazene compounds (m≧5), and the linear phenoxyphosphazene compounds, of which the weight ratio are between 1% and 10%;

(α)

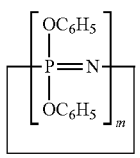

wherein, m represents an integer between 3 and 25;

(β)

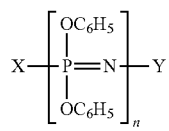

wherein, X represents —N=P(OC$_6$H$_5$)$_3$ or —N=P(O)C$_6$H$_5$, and Y represents —P(OC$_6$H$_5$)$_4$ or —P(O)(C$_6$H$_5$)$_2$; n represents an integer between 3 and 100.

2. The halogen-free flame retardant resin composition of claim 1, wherein the dihydrobenzoxazine ring-containing compound (A2) comprises at least one of the bisphenol-A benzoxazine resin, bisphenol-F benzoxazine resin, phenolphthalein benzoxazine resin, and MDA (4,4'-Methylenedianiline) benzoxazine resin shown with the structural formula (γ) or (δ) relatively;

(γ)

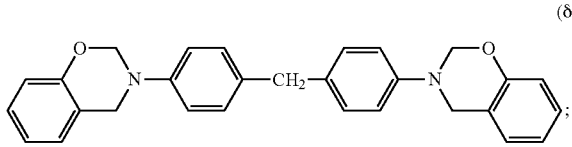

(δ)

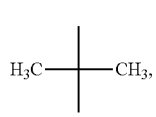

wherein, R is

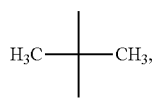

—CH$_2$—, or

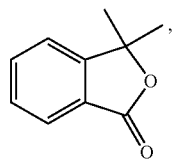

and R1 is

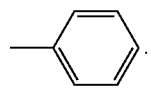

3. The halogen-free flame retardant resin composition of claim 1, wherein the polyepoxy compound (B) is at least one compound selected from bisphenol-A epoxy resin, bisphenol-F epoxy resin, phenol novolac epoxy resin, o-cresol novolac epoxy resin, bisphenol-A novolac epoxy resin, oxazolidone ring-containing halogen-free epoxy resin, and epoxide polybutadiene.

4. The halogen-free flame retardant resin composition of claim 1, wherein the phenolic resin type hardener is at least one compound selected from phenol novolac resin, bisphenol-A novolac resin, nitrogen-containing novolac resin, and phosphorus-containing novolac resin.

5. The halogen-free flame retardant resin composition of claim 1, wherein the imidazole compound (D) as the curing accelerator is at least one compound selected from 2-methylimidazole, 2-ethyl-4-methylimidazole, 2-phenylimidazole, and 2-undecylimidazole.

6. The halogen-free flame retardant resin composition of claim 1, further comprising 6-300 parts by weight of an inorganic filler; the inorganic filler is a mixture of aluminium hydroxide and silica and other inorganic fillers.

7. The halogen-free flame retardant resin composition of claim 1, further defined as a prepreg made from the halogen-free flame retardant resin composition comprising a base material and the halogen-free flame retardant resin composition, the halogen-free flame retardant resin composition adhering to the base material after the base material being impregnated in the resin composition and then being dried.

8. The halogen-free flame retardant resin composition of claim 1, further defined as a laminate made from the halogen-free flame retardant resin composition comprising a plurality of prepregs mutually overlapped; each prepreg including a base material and a halogen-free flame retardant resin composition, the halogen-free flame retardant resin composition adhering to the base material after the base material being impregnated in the resin composition and then being dried.

9. The halogen-free flame retardant resin composition of claim 1, further defined as a laminate for printed circuit made from the halogen-free flame retardant resin composition comprising a plurality of prepregs mutually overlapped and a metal foil arranged to one or two surfaces of the overlapped prepregs; each prepreg including a base material and a halogen-free flame retardant resin composition, the halogen-free flame retardant resin composition adhering to the base material after the base material being impregnated in the resin composition and then being dried.

* * * * *